US010217857B2

(12) United States Patent
Kim et al.

(10) Patent No.: US 10,217,857 B2
(45) Date of Patent: Feb. 26, 2019

(54) SUPER JUNCTION MOSFET AND METHOD OF MANUFACTURING THE SAME

(71) Applicant: DONGBU HITEK CO., LTD., Seoul (KR)

(72) Inventors: Young Seok Kim, Gyeonggi-do (KR); Bum Seok Kim, Seoul (KR)

(73) Assignee: DB Hitek Co., Ltd, Seoul (KR)

( * ) Notice: Subject to any disclaimer, the term of this patent is extended or adjusted under 35 U.S.C. 154(b) by 0 days.

(21) Appl. No.: 15/641,409

(22) Filed: Jul. 5, 2017

(65) Prior Publication Data

US 2018/0012990 A1 Jan. 11, 2018

(30) Foreign Application Priority Data

Jul. 6, 2016 (KR) .................. 10-2016-0085308

(51) Int. Cl.
| | |
|---|---|
| *H01L 29/78* | (2006.01) |
| *H01L 21/265* | (2006.01) |
| *H01L 21/311* | (2006.01) |
| *H01L 29/06* | (2006.01) |
| *H01L 29/66* | (2006.01) |
| *H01L 29/423* | (2006.01) |

(52) U.S. Cl.
CPC .... *H01L 29/7811* (2013.01); *H01L 21/26513* (2013.01); *H01L 21/31111* (2013.01); *H01L 29/0634* (2013.01); *H01L 29/0696* (2013.01); *H01L 29/66666* (2013.01); *H01L 29/66712* (2013.01); *H01L 29/7827* (2013.01); *H01L 29/4236* (2013.01); *H01L 29/7813* (2013.01)

(58) Field of Classification Search
CPC ............. H01L 29/7811; H01L 29/0634; H01L 29/66712; H01L 21/26513; H01L 21/31111; H01L 29/0696; H01L 29/7827; H01L 29/66666; H01L 29/4236; H01L 29/7813
USPC ......................................... 257/329
See application file for complete search history.

(56) References Cited

U.S. PATENT DOCUMENTS

| | | | | |
|---|---|---|---|---|
| 2004/0238844 | A1* | 12/2004 | Tokano ............... | H01L 29/0634 257/197 |
| 2005/0133859 | A1* | 6/2005 | Kuwahara ........... | G06F 17/5068 257/328 |
| 2009/0032851 | A1* | 2/2009 | Pfirsch ................. | H01L 21/221 257/288 |

* cited by examiner

*Primary Examiner* — Marc Armand
*Assistant Examiner* — Sue Tang
(74) *Attorney, Agent, or Firm* — Patterson Thuente Pederson, P. A.

(57) ABSTRACT

A super junction MOSFET includes a substrate having a first conductive type, an epitaxial layer formed on the substrate, a set of pillars extending from the substrate through the epitaxial layer, the set of pillars being spaced apart from each other, a set of first wells, the set of first wells formed in the epitaxial layer to extend to an upper face of the epitaxial layer, and each of the set of first wells connected to at least one corresponding pillar of the set of pillars, a set of second wells of the first conductive type formed in the set of first wells, and a plurality of gate structures formed on the epitaxial layer, each extending in a first direction to have a stripe shape such that the gate structures are spaced apart from each other. Thus, the gate structure has a relatively small area to reduce an input capacitance of the super junction MOSFET.

3 Claims, 5 Drawing Sheets

[FIG. 1]
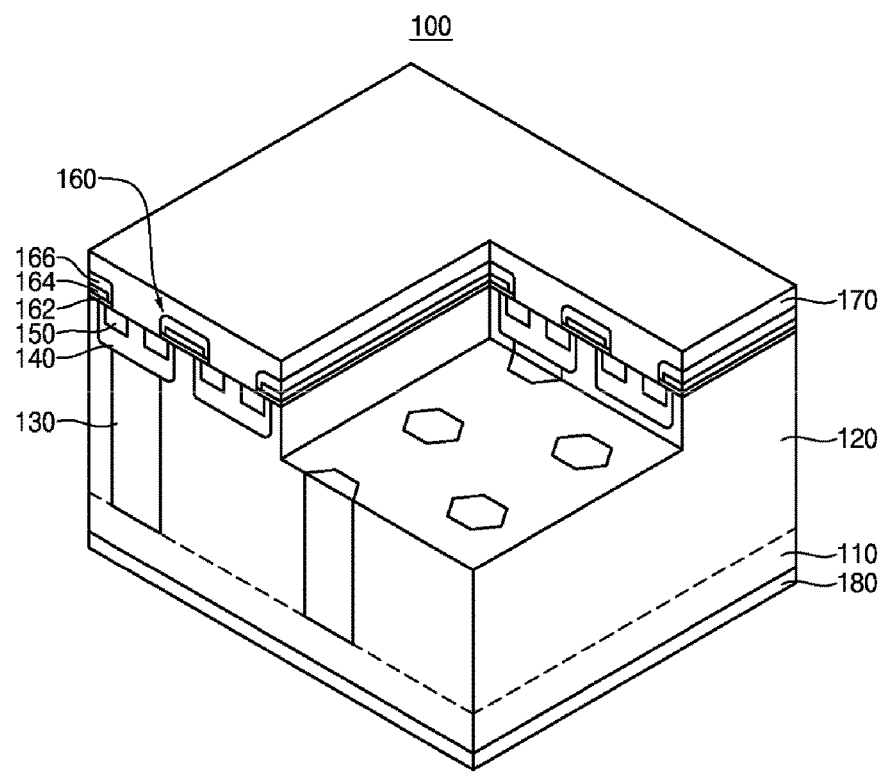
[FIG. 2]
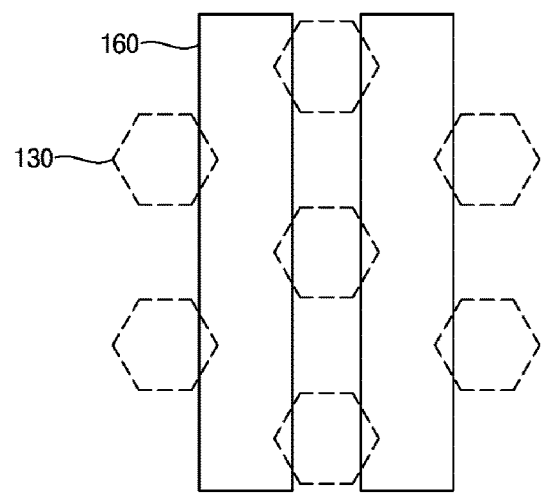

[FIG. 3]
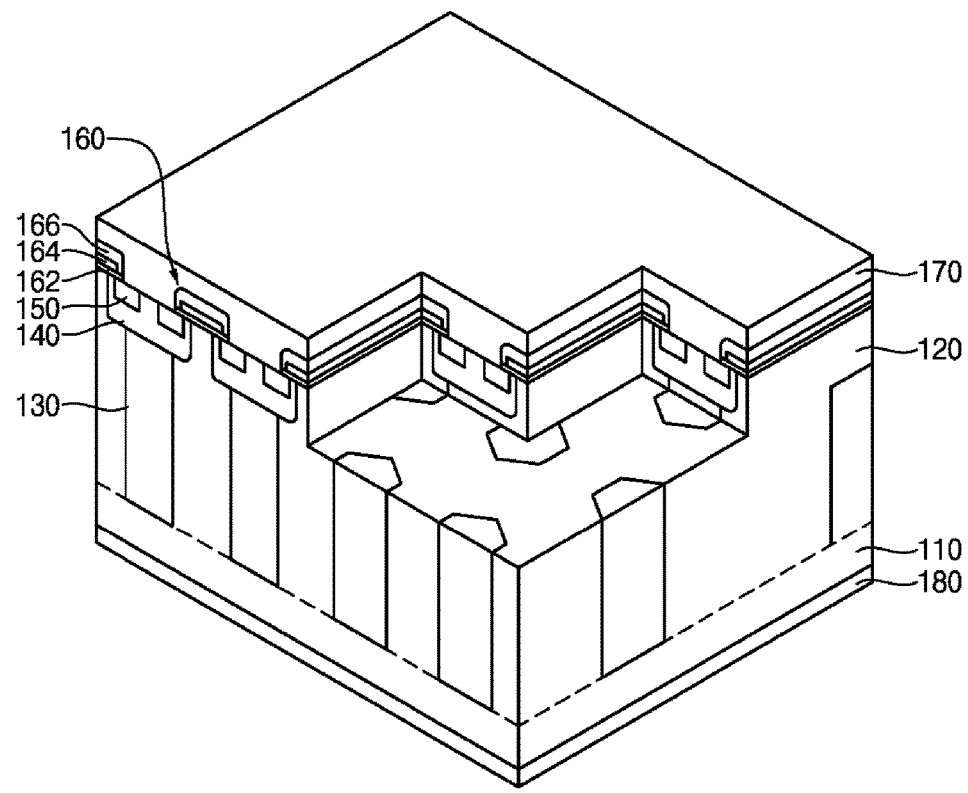
[FIG. 4]
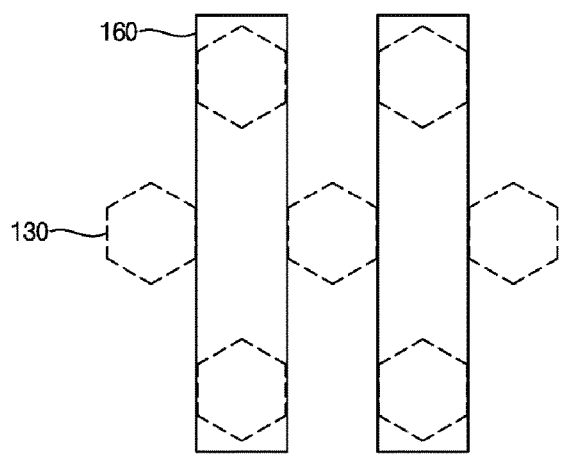

[FIG. 5]
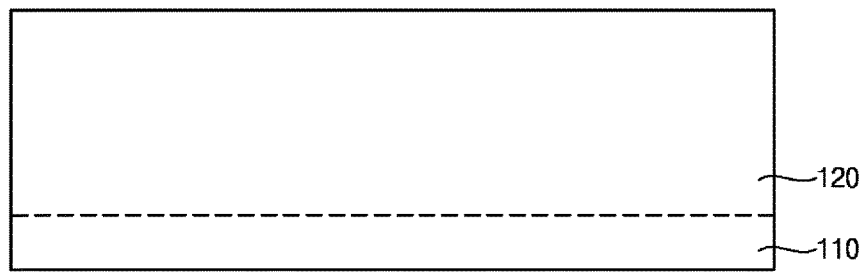
[FIG. 6]
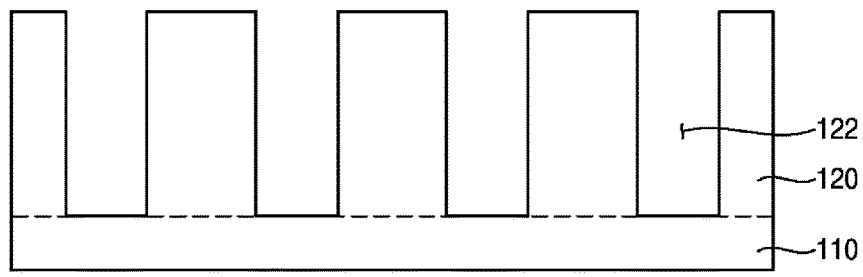
[FIG. 7]
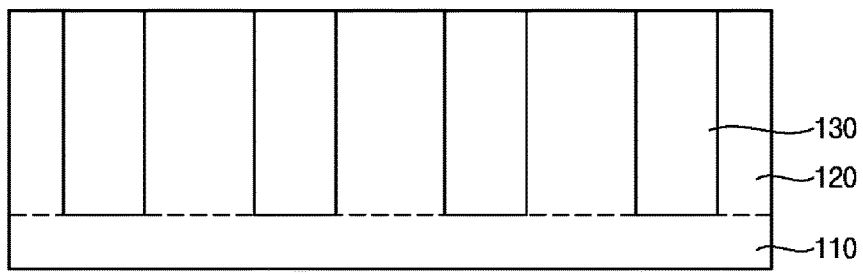

[FIG. 8]
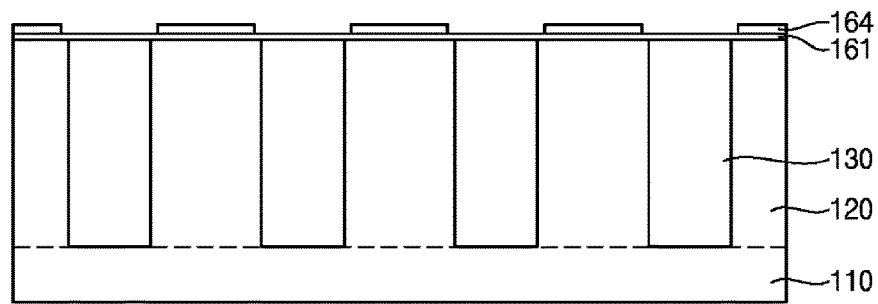
[FIG. 9]
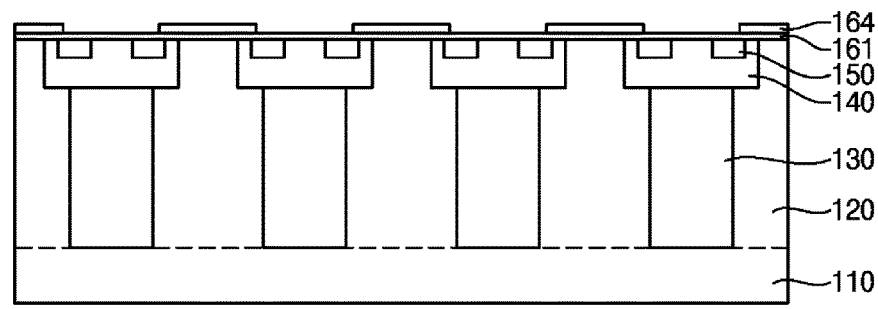
[FIG. 10]
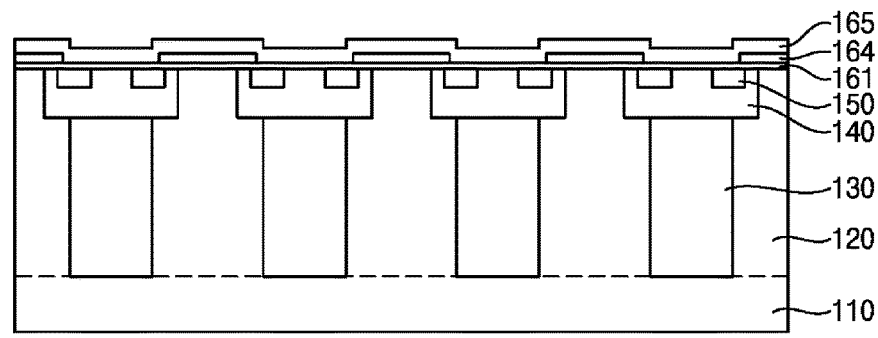

[FIG. 11]
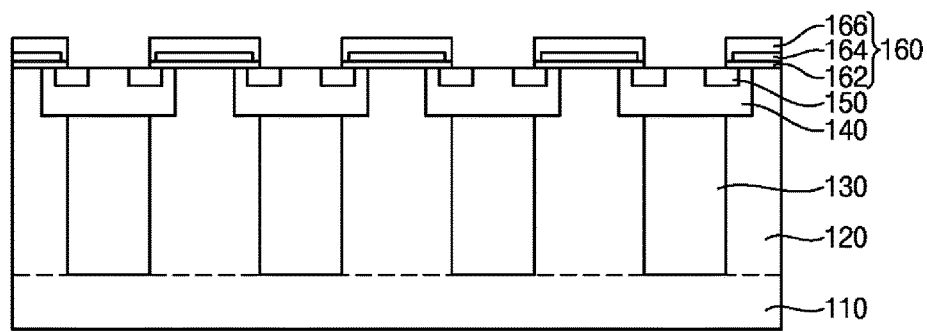
[FIG. 12]
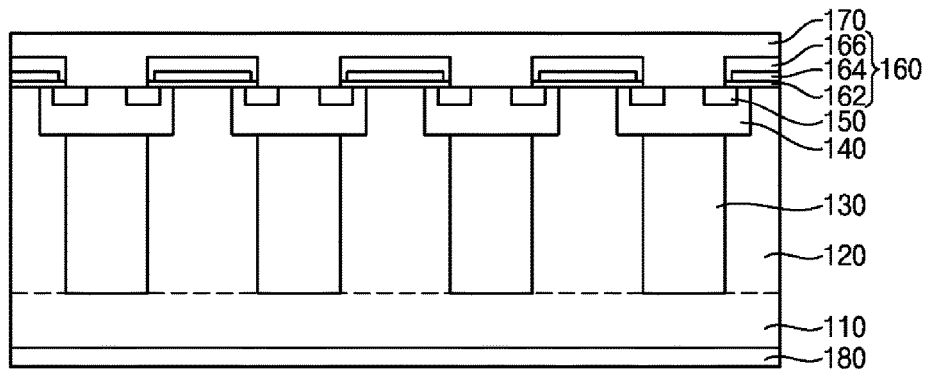

SUPER JUNCTION MOSFET AND METHOD OF MANUFACTURING THE SAME

CROSS-REFERENCE TO RELATED APPLICATION

This application claims priority to Korean Patent Application No. 10-2016-0085308, filed on Jul. 6, 2016 and all the benefits accruing therefrom under 35 U.S.C. § 119, the contents of which are incorporated by reference in their entirety.

TECHNICAL FIELD

The present disclosure relates to a metal oxide semiconductor field effect transistor (hereinafter, referred to as MOSFET), and more particularly, to a super junction MOSFET.

BACKGROUND

Generally, a super junction structure has been widely used to improve a trade-off relation between forward characteristics and reverse characteristics related to a breakdown voltage in a power semiconductor device.

According to the prior art, pillars and gate structures in the super junction MOSFET have the same layout. Examples of the layout include a linear array, a square array, a hexagonal array, and the like.

An on-resistance $R_{sp}$ increases in proportion to an area occupied by the pillars in an active region. An input capacitance also increases in proportion to an area occupied by the gate structure. The area of the pillars decreases in an order of the linear array, the square array, and the hexagonal array. The area of the gate structure increases in an order of the linear array, the square array, and the hexagonal array.

Therefore, when the layouts of the pillars and the gate structure are linear, the on-resistance increases because of a relatively large area of the pillars, but the input capacitance decreases due to a relatively small area of the gate structure.

Meanwhile, when the layouts of the pillars and the gate structure are hexagonal, the on-resistance decreases due to a relatively small area of the pillars, but the gate capacitance increases due to a relatively large area of the gate structure.

Therefore, there is still a need for a layout of the pillars and the gate structure that can reduce the on-resistance as well as the input capacitance simultaneously.

SUMMARY

The example embodiments of the present disclosure provide a super junction MOSFET capable of lowering the on-resistance as well as the input capacitance simultaneously According to an example embodiment of the present disclosure, a super junction MOSFET includes a substrate having a first conductive type, an epitaxial layer formed on the substrate, the epitaxial layer having the first conductive type, a set of pillars extending from the substrate through the epitaxial layer, the set of pillars being spaced apart from each other, a set of first wells, each of the set of first wells having a second conductive type, the set of first wells formed in the epitaxial layer to extend to an upper face of the epitaxial layer, and each of the set of first wells connected to at least one corresponding pillar of the set of pillars, a set of second wells of the first conductive type formed in the set of first wells, and a plurality of gate structures formed on the epitaxial layer, each extending in a first direction to have a stripe shape such that the gate structures are spaced apart from each other.

In an example embodiment, the set of pillars may be spaced apart from one another along the first direction to have multiple columns such that the pillars are arranged to have a hexagonal array in a serpentine pattern along the first direction.

Here, each of the gate structures may extend between two columns of the set of first wells.

In an example embodiment, the set of pillars may be spaced apart from one another along a second direction perpendicular to the first direction to have multiple rows such that the pillars are arranged to have a hexagonal array in a serpentine pattern along the second direction.

Here, the pillars may include some of the pillars arranged in a first row and others of the pillars arranged in a second row parallel and adjacent to the first row, and each of the gate structures extends between the some of the pillars having the first row and over the others of the pillars having the second row.

Here, the others of the set of pillars may be formed in the epitaxial layer, and are spaced apart from the first wells and the gate structures.

In an example embodiment, each of the set of pillars may have one of a hexagonal, a circular or a rectangular cross-section.

In an example embodiment, each of the gate structures may include a gate insulating layer formed on the epitaxial layer, a gate electrode formed on the gate insulating layer and an insulating interlayer surrounding the gate electrode.

In an example embodiment, each of the gate structures may be formed inside of the epitaxial layer to extend along the first direction.

According to an example embodiment of the present disclosure, a super junction MOSFET is manufactured by forming an epitaxial layer of a first conductive type on a substrate of the first conductive type, forming a set of pillars of a second conductive type in the epitaxial layer, the set of pillars extending through the epitaxial layer and spaced apart from one another, forming a preliminary gate insulating layer on the epitaxial layer in which the set of pillars are formed, forming gate electrodes on the preliminary gate insulating layer to expose a portion of the preliminary insulating layer, each having a stripe shape and extending in a first direction, implanting impurities of the second conductive type into upper portions of the pillars using the gate electrodes as a mask to form a set of first wells, implanting impurities of the first conductive type into the set of first wells to form a set of second wells that serve as source regions, forming a preliminary insulating interlayer to cover the gate electrode and the exposed portion of the preliminary gate insulating layer and partially etching the preliminary insulating interlayer and the preliminary gate insulating layer until the first wells are exposed to form a gate structure including a gate insulating layer, the gate electrode and an insulating interlayer.

In an example embodiment, the set of pillars may be spaced apart from one another along the first direction to have multiple columns such that the pillars are arranged to have a hexagonal array in a serpentine pattern along the first direction.

In an example embodiment, the set of pillars may be spaced apart from one another along a second direction perpendicular to the first direction to have multiple rows such that the pillars are arranged to have a hexagonal array in a serpentine pattern along the second direction.

Here, the pillars may include some of the pillars arranged in a first row and others of the pillars arranged in a second row parallel and adjacent to the first row, each of the gate structures extends between the some of the pillars having the first row and over the others of the pillars having the second row, and the others of the set of pillars are formed in the epitaxial layer, and are spaced apart from the first wells and the gate structures.

In an example embodiment, each of the set of pillars may be formed to have one of a hexagonal, a circular, or a rectangular cross-section.

In an example embodiment, each of the gate structures may have a planar structure.

In an example embodiment each of the gate structures may be formed inside of the epitaxial layer to extend along the first direction.

According to example embodiments of the super junction MOSFET and the method of manufacturing the super junction MOSFET, the pillars are arranged in a hexagonal shape to minimize an area of the super junction MOSFET. Therefore, the on-resistance of the super junction MOSFET can be reduced by minimizing the area of the pillars.

In addition, since each of the gate structure extends in one direction to have a stripe shape, the area of the gate structures is relatively small so that the input capacitance of the super junction MOSFET can be reduced.

Therefore, the super junction MOSFET can have a low value of the on-resistance and a low value of the input capacitance value relatively.

BRIEF DESCRIPTION OF THE DRAWINGS

Example embodiments can be understood in more detail from the following description taken in conjunction with the accompanying drawings, in which:

FIG. 1 is a cutaway perspective view illustrating a super junction MOSFET in accordance with an example embodiment of the present disclosure;

FIG. 2 is a partial exploded plan view illustrating a layout of the pillars and the gate structures in FIG. 1;

FIG. 3 is a cutaway perspective view illustrating a super junction MOSFET in accordance with an example embodiment of the present disclosure;

FIG. 4 is a partial exploded plan view illustrating a layout of the pillars and the gate structures in FIG. 3; and FIGS. 5 to 12 are cross sectional views illustrating a method of manufacturing a super junction MOSFET in accordance with an example embodiment of the present disclosure.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a layer a region or a plate is referred to as being 'on' another one, it can be directly on the other one, or one or more intervening layers, regions, or plates may also be present. By contrast, it will also be understood that when a layer, a film, a region or a plate is referred to as being 'directly on' another one, it is directly on the other one, and one or more intervening layers, films, regions or plates do not exist. Also, though terms such as a first, a second, and a third are used to describe various components, composi- tions, regions, films, and layers in various embodiments of the present disclosure, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. The Figures are not necessarily drawn to scale. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present invention.

FIG. 1 is a cutaway perspective view illustrating a super junction MOSFET in accordance with an example embodiment of the present invention. FIG. 2 is a partial exploded plan view illustrating a layout of the pillars and the gate structures in FIG. 1.

Referring to FIGS. 1 and 2, a super junction MOSFET 100 in accordance with an example embodiment of the present invention includes a substrate 110, an epitaxial layer 120, pillars 130, first wells 140, second wells 150, gate structures 160, a source electrode 170 and a drain electrode 180.

The substrate 110 may include a silicon substrate and has a first conductive type, for example, a high concentration $n^+$ type.

The epitaxial layer 120 is formed on the substrate 110 and has the first conductive type, for example, a low concentration n type. The epitaxial layer 120 may be formed by an epitaxial growth process.

The pillars 130 are provided inside the epitaxial layer 120 to extend in a vertical direction. The pillars 130 have a second conductive type, for example, a $p^-$ type. The pillars 130 are spaced apart from one another by a predetermined distance in a horizontal direction.

For example, each of the pillars 130 has a hexagonal shape as a sectional shape. Further, the pillars 130 are spaced apart from one another at a predetermined interval along a first direction to have multiple columns such that the pillars are arranged to have a hexagonal array in a serpentine pattern along the first direction as shown in FIG. 2. Here, the first direction is defined as an extension direction of the each of the gate structures 160.

Some of the pillars 130 are arranged in the first direction to make a first column of the pillars 130, whereas others of the pillars 130 are arranged in the first direction to make a second column of the pillars 130 parallel and adjacent to the first column.

When the pillars 130 are arranged in the serpentine pattern, an area of the pillars 130 which are occupied inside of the epitaxial layer 120 is minimized. Thus, an on-resistance of the super junction MOSFET 100 can be reduced by minimizing the area of the pillars 130.

In addition, the sectional shape of each of the pillars 130 may vary. For example, the sectional shape of each of the pillars 130 is hexagonal as shown in FIGS. 1 and 2. Alternatively, the sectional shape of each of the pillars 130 is rectangular or circular.

The pillars 130 of the p⁻ type conductivity are provided in the epitaxial layer 120 of the n⁻ type conductivity to form a super junction structure. When a reverse voltage is applied to the super junction MOSFET 100, electric field is formed along a direction parallel with respect to a junction surface (i.e., a PN junction surface) between each of the pillars 130 and the epitaxial layer 120 such that electric field has a polygon column shape to enlarge an area of a region of electric field. Thus, the epitaxial layer 120 can be completely converted into a depletion region by adjusting an amount of charges which flow through the pillars 130 and the epitaxial layer 120. As a result, the super junction MOSFET 100 according to an example embodiment can keep a value of a breakdown voltage substantially identical to that of a conventional MOSFET, even thought the epitaxial layer 120 has a doping concentration higher than that of an epitaxial layer formed in the conventional MOSFET.

The first wells 140 are formed at a predetermined depth on an upper portion of the epitaxial layer 120 and extend along a first direction. The first wells 140 are spaced apart from one another. The first wells 140 are connected to upper portions of the pillars 130 in the epitaxial layer 120, respectively. Each of the first wells 140 has the second conductive type, e.g., p⁻ type.

The second wells 150 are located inside the first wells 140, respectively. For example, the second wells 150 may be provided at upper portions of the first wells 140 at a predetermined depth. Each of the second wells 150 has the first conductive type, for example, a high concentration n⁺ type.

Meanwhile, although not shown, a third well of the second conductive type, for example, a high concentration p+ type, may be positioned between a pair of the second wells 150 located inside the first wells 140.

The gate structures 160 are located on the epitaxial layer 120. Each of the gate structures 160 are positioned directly on an upper face of the epitaxial layer 120, having a flat face such that each of the gate structure has a planar structure.

Each of the gate structures 160 extends along the first direction to have a stripe shape such that the gate structures 160 are spaced apart from one another. The gate structures 160 are positioned between the first column of the pillars 130 and the second column of the pillars 130 in a plan view.

Since each of the gate structures 160 has a stripe shape, the gate structures 160 have relatively small areas so that an input capacitance of the super junction MOSFET 100 can be reduced.

In an example embodiment, each of the gate structures 160 includes a gate insulating layer 162, a gate electrode 164 and an insulating interlayer 166.

The gate insulating layer 162 is provided on the epitaxial layer 120. The gate insulating layer 162 extends between the pillars 130 to be apart from each other. For example, the gate insulating layer 162 is formed to partially cover the second wells 150 each of which is located in each of the first wells 140 different from and are adjacent to each other. That is, a width of the gate insulating layer 162 may be substantially the same as a distance between the second wells 150 which are located in the different first wells 140, respectively, and are adjacent to each other. The gate insulating layer 162 may include an oxide.

The gate electrode 164 is located on the gate insulating layer 162. A width of the gate electrode 164 may be narrower than that of the gate insulating layer 162. For example, the gate electrode 164 includes polysilicon.

The insulating interlayer 166 is disposed on the gate electrode 164 so as to surround the gate electrode 164. The insulating interlayer 166 electrically isolates the gate electrode 164 and the source electrode 170 from each other. The insulating interlayer 166 may include a nitride layer In an example embodiment, although not shown, the gate structure 160 may have a trench structure. In this case, the gate structure 160 is formed inside of the epitaxial layer 120 to extend along the first direction.

Specifically, a trench is formed in the epitaxial layer 120 at a certain depth. The gate insulating layer 162 is provided along an inner wall of the trench so as to extend over upper portions of the pillars 130 adjacent to each other. For example, the gate insulating layer 162 has a sectional shape of substantially U-shape. That is, the gate insulating layer 162 is formed to extend in the first direction between the first wells 140 adjacent to each other. The gate insulating layer 162 makes in contact with the second wells 150 which are located in different first wells 140 and are adjacent to each other.

The gate electrode 164 is provided on the gate insulating layer 162 to partially fill the trench formed in the epitaxial layer 120

The insulating interlayer 166 is provided to cover the gate insulating layer 162 and the gate electrode 164.

When the gate structure 160 has the trench structure, an interval between the pillars 130 can be reduced, and the super junction MOSFET 100 can have improved forward characteristics by enhancing a degree of integration of the super junction MOSFET 100.

The source electrode 170 is formed on the epitaxial layer 120 to cover the gate structures 160. The source electrode 170 is electrically connected to the second wells 150 which can serve as source regions.

The drain electrode 180 is formed on a lower face of the substrate 110. When the super junction MOSFET 100 turn on, electrons are injected from the second wells 150 serving as the source regions through channels formed in the first wells 140 and then, are injected through the epitaxial layer 120 to the drain electrode 180. As a result, current flows.

According to an example embodiment of the super junction MOSFET 100, the pillars 130, each having the hexagonal shape, are arranged and the gate structures 160, each having a stripe shape, extend such that the super junction MOSFET 100 can reduce the on-resistance value and can decrease the input capacitance value.

FIG. 3 is a cutaway perspective view illustrating a super junction MOSFET in accordance with an example embodiment of the present invention. FIG. 4 is a partial exploded plan view illustrating a layout of the pillars and the gate structures in FIG. 3.

Referring to FIGS. 3 and 4, gate structures 160 are located on an epitaxial layer 120 and each of the gate structures 160 has a stripe shape extending in a first direction. Further, the gate structures 160 are spaced apart from one another.

Further, pillars 130 are arranged along a second direction perpendicular to the first direction to have multiple rows along the second direction. The pillars 130 are arranged to have a hexagonal array in a serpentine pattern along the second direction.

Specifically, some of the pillars 130 are arranged in the second direction to have a first row of the pillars 130, whereas others of the pillars 130 are arranged in the second direction to have a second row of the pillars 130 parallel and adjacent to the first row. Each of the gate structures 160 extends between the some of the pillars 130 having the first row and over the others of the pillars 130 having the second row.

The some of pillars 130 located below the gate structures 160 are positioned in the epitaxial layer 120 and are spaced apart from the gate structure 160. Further, the some of pillars 130 are not connected to first wells 140. That is, the some of the pillars 130 may keep a floating state.

Meanwhile, the others of the pillars 130 located under the gate structures 160 may be connected to the first wells 140.

FIGS. 5 to 12 are cross sectional views illustrating a method of manufacturing a super junction MOSFET in accordance with an example embodiment of the present invention.

Referring to FIG. 5, an epitaxial layer 120 of a first conductive type, for example, a low concentration n type is formed on a substrate 110 of the first conductive type, for example, a high concentration n$^+$ type. The epitaxial layer 120 may be formed by performing an epitaxial growth process against the substrate 110.

Referring to FIG. 6, after a first mask pattern (not shown) is formed on an upper face of the epitaxial layer 120, an etching process using a first mask pattern as an etching mask is performed to form trenches 122 for forming pillars 130 (see FIG. 7) in the epitaxial layer. The first mask pattern may be formed using photoresist.

The trenches 122 are spaced apart from one other by a predetermined distance in a horizontal direction. For example, each of the trenches 122 has a hexagonal sectional shape. Alternatively, each of the trenches 122 may have various sectional shapes. For example, each of the trenches 122 has a square or circular sectional shape.

The first mask pattern can be removed after forming the trenches 122.

Referring to FIG. 7, after a second mask pattern is formed on an upper face of the epitaxial layer 120 except for the trenches 122, impurities of a second conductive type, for example, p$^-$ type are implanted into a lower portion of the substrate 110 exposed by the trenches 122. The second mask pattern may be formed using oxide, and boron (B) ions may be used as the p-type impurities.

After the second mask pattern is removed, an epitaxial process is performed to form a filling layer in the trenches 122 and on the epitaxial layer 120, and then, a CMP (Chemical Mechanical Polishing) process for polishing a portion the filling layer is performed to expose an upper face of the epitaxial layer 120, which consists of one cycle of a trench filling process. The trench filling process is repeated to fill the trenches 122 to form pillars 130 in the trenches 122.

The pillars 130 fill the trenches 122 with growing with the impurities of the second conductive type, such as a p$^-$ type, which are implanted into the lower portion of the substrate 110. Thus, the pillars 130 extend in a vertical direction to have the second conductive type in the epitaxial layer 120.

Further, the pillars 130 are spaced apart from each other by a predetermined distance in the horizontal direction. Each of the pillars 130 may have a hexagonal shape. When the pillars 130, each having the hexagonal shape are arranged, an area of the pillars 130 of being occupied in the epitaxial layer 120 is minimized. Accordingly, the area of the pillars 130 can be minimized, thereby reducing the on-resistance $R_{sp}$ of the super junction MOSFET 100.

Each of the pillars 130 may have various sectional shapes. For example, the sectional shape of each of the pillars 130 is hexagonal, rectangular, or circular.

Referring to FIG. 8, a preliminary gate insulating layer 161 is formed on the epitaxial layer 120 in which the pillars 130 are formed, and then, a polysilicon layer (not shown) for forming an gate electrode is formed on the preliminary gate insulating layer 161. For example, the preliminary gate insulating layer is formed using oxide.

The polysilicon layer is patterned through a photolithography process to form gate electrodes 164 on the preliminary gate insulating layer 161. Each of the gate electrodes 164 may have a stripe shape to extend in a first direction.

In one example, each of the gate electrodes 164 may be positioned between the pillars 130 when viewed in plan.

In another example, each of the gate electrodes 164 may be formed between some of the pillars 130 and over others of the pillars 130.

On the other hand, when the gate structure 160 has a trench structure other than a planar structure as described above, trenches having a certain depth extending in the first direction are formed at an upper portion of the epitaxial layer 120.

In one example, the trenches may be positioned to extend between the pillars 130, when viewed in plan.

In another example, the trenches can be positioned between the some of the pillars 130 and over the others of the pillars 130, when viewed in plan. In this case, the some of the trenches are not connected to the pillars 130.

The preliminary gate insulating layer 161 is formed on an upper face of the epitaxial layer 120 in which the pillars 130 are formed and on inner walls of the trenches.

The polysilicon layer is formed to fill the trenches in which the preliminary gate insulating layer 161 is formed, and then, the polysilicon layer is partially etched to expose a portion of the preliminary gate insulating layer 161 located out of the trenches such that the gate electrodes 164 are formed to fill the trenches.

Referring to FIG. 9, first wells 140 are formed by implanting impurities of a second conductive type, for example, a p-type into upper regions of the pillars 130 using the gate electrode 164 as a mask.

When each of the gate electrodes 164 is positioned between the pillars 130, the pillars 130 are located between the gate electrodes 164, and the first wells 140 are formed at upper portions of the pillars 130 such that the first wells 140 are connected with all of the pillars 130.

If the gate electrodes 164 extend between the some of the pillars 130 and over the others of the pillars 130, when viewed in plan, the some of the pillars 130 are located between the gate electrodes 164 whereas the others of the pillars 130 are located under the gate electrodes 164. Therefore, the first wells 140 can be formed at the upper portions of the some of the pillars 130, but the first wells 140 cannot be formed at the upper portions of the others of the pillars 130.

Next, impurities of the first conductive type, for example, a high concentration n$^+$ type are implanted into the first wells 140 to form at least one second well 150 which serves as a source region. Meanwhile, at least one second well 150 may be formed in each of the first wells 140 and may be formed using a mask pattern. For example, two second wells 150 may be formed in pairs in each of the first wells 140.

Referring to FIG. 10, a preliminary insulating interlayer 165 is formed to cover the gate electrodes 164 and the exposed portion of the preliminary gate insulating layer 161. For example, the preliminary insulating interlayer 165 is formed using nitride. After forming the preliminary insulating interlayer 165, impurities of the second conductive type, for example, high concentration p⁺ type may be further implanted between the pair of the second wells 150 to form a third well.

Referring to FIG. 11, the preliminary insulating interlayer 165 and the preliminary gate insulating layer 161 are partially etched through a photolithography process to form an insulating interlayer 166 and a gate insulating layer 162. Therefore, the gate structure 160 including the gate insulating layer 162, the gate electrode 164, and the insulating interlayer 166 can be formed.

Since each of the gate electrodes 164 have a stripe shape to extending in one direction and extends above the pillars 130 and between the pillars 130, each of the gate structures 160 also have a stripe shape to extend in one direction above the pillars 130.

Since each of the gate structures 160 has a stripe shape, the gate structures 160 has a relatively small area, so that an input capacitance of the super junction MOSFET 100 is reduced.

In addition, the preliminary insulating interlayer and the preliminary gate insulating layer 161 are partially etched to expose the upper faces of the first wells 140.

Referring to FIG. 12, a first metal layer is formed on the epitaxial layer 120 to cover the gate structures 160 such that a source electrode 170 is formed. The source electrode 170 may make electrical contact with the second wells 150 which serve as the source regions.

Further, a second metal layer is formed on a lower face of the substrate 110 to form the drain electrode 180.

Since the pillars 130 included in the super junction MOSFET 100 are arranged, each having a hexagonal shape, and each of the gate structures 160 have a stripe shape, the super junction MOSFET 100 according to example embodiments of the present invention, can reduce the on-resistance and the input capacitance value.

As described above, according to the super junction MOSFET and the method of manufacturing in example embodiments of the present invention, the pillars are arranged, each having a hexagonal shape such that the on-resistance of the super junction MOSFET can be reduced by minimizing the area of the fillers. Since each of the gate structures has a stripe shape to extend in one direction, the area of the gate structures is relatively small, so that the input capacitance of the super junction MOSFET can be reduced.

The input capacitance value can be reduced while lowering the on-resistance of the super junction MOSFET, so that the performance of the super junction MOSFET can be improved.

Although the super junction MOSFET has been described with reference to the specific embodiments, they are not limited thereto. Therefore, it will be readily understood by those skilled in the art that various modifications and changes can be made thereto without departing from the spirit and scope of the appended claims.

The invention claimed is:

1. A super junction MOSFET comprising:
a substrate having a first conductive type;
an epitaxial layer formed on the substrate, the epitaxial layer having the first conductive type;
a set of pillars extending from the substrate through the epitaxial layer, the set of pillars being spaced apart from each other;
a set of first wells, each of the set of first wells having a second conductive type, the set of first wells formed in the epitaxial layer to extend to an upper face of the epitaxial layer, and each of the set of first wells connected to at least one corresponding pillar of the set of pillars;
a set of second wells of the first conductive type formed in the set of first wells; and
a plurality of gate structures formed on the epitaxial layer, each extending in a first direction to have a stripe shape such that the gate structures are spaced apart from each other,
wherein the set of pillars are spaced apart from one another along a second direction perpendicular to the first direction to have multiple rows such that the pillars are arranged to have a hexagonal array in a serpentine pattern along the second direction,
wherein the set of pillars includes a first group of the set of pillars arranged in a first row and a second group of the set of pillars arranged in a second row parallel and adjacent to the first row, and each of the gate structures extends between members of the first group of the set of pillars and over members of the second group of the set of pillars, and
wherein the second group of the set of pillars are formed in the epitaxial layer, and are spaced apart from the first wells and the gate structures.

2. The super junction MOSFET of claim 1, wherein each of the set of pillars has one of a hexagonal, a circular or a rectangular cross-section.

3. The super junction MOSFET of claim 1, wherein each of the plurality gate structures includes:
a gate insulating layer formed on the epitaxial layer;
a gate electrode formed on the gate insulating layer; and
an insulating interlayer surrounding the gate electrode.

* * * * *